(12) United States Patent
Brodsky et al.

(10) Patent No.: US 6,545,226 B2
(45) Date of Patent: Apr. 8, 2003

(54) PRINTED WIRING BOARD INTERPOSER SUB-ASSEMBLY

(75) Inventors: William Louis Brodsky, Binghamton, NY (US); Benson Chan, Vestal, NY (US); Michael Anthony Gaynes, Vestal, NY (US); Voya Rista Markovich, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/871,556

(22) Filed: May 31, 2001

(65) Prior Publication Data

US 2002/0179331 A1 Dec. 5, 2002

(51) Int. Cl.$^7$ .............................. H05K 1/11; H05K 1/16
(52) U.S. Cl. ..................... 174/260; 174/262; 174/264; 361/760; 361/769; 439/65; 439/91; 257/698; 257/738; 257/778
(58) Field of Search ................ 174/262, 260, 174/261, 263, 264, 266; 361/760, 769, 767, 785, 787; 439/65, 66, 73, 74, 82, 83, 84, 91; 257/698, 737, 738, 778, 780

(56) References Cited

U.S. PATENT DOCUMENTS

| | | | | |
|---|---|---|---|---|
| 4,667,219 A | * | 5/1987 | Lee et al. ................ 257/693 |
| 4,764,848 A | * | 8/1988 | Simpson ................... 174/52.4 |
| 4,988,306 A | | 1/1991 | Hopfer, III et al. ........ 439/66 |
| 5,122,067 A | | 6/1992 | Sunne ........................ 439/91 |
| 5,474,458 A | * | 12/1995 | Vafi et al. .................. 439/66 |
| 5,477,933 A | * | 12/1995 | Nguyen ..................... 174/262 |
| 5,535,101 A | * | 7/1996 | Miles et al. ............... 174/260 |
| 5,599,193 A | | 2/1997 | Crotzer ...................... 439/66 |
| 5,650,919 A | | 7/1997 | Loh et al. .................. 361/779 |
| 5,720,630 A | | 2/1998 | Richmond et al. ......... 439/591 |
| 5,772,451 A | * | 6/1998 | Dozier, II et al. ........... 439/70 |
| 5,810,607 A | * | 9/1998 | Shih et al. .................. 439/66 |
| 5,859,470 A | * | 1/1999 | Ellerson et al. ............ 257/772 |
| 5,886,590 A | | 3/1999 | Quan et al. ................. 333/33 |
| 5,899,757 A | | 5/1999 | Neidich et al. ............. 439/67 |
| 5,911,863 A | * | 6/1999 | Vetter et al. ............... 205/103 |
| 5,939,783 A | | 8/1999 | Laine et al. ............... 257/702 |
| 5,940,278 A | * | 8/1999 | Schumacher .............. 361/769 |
| 5,967,798 A | * | 10/1999 | Tustaniwskyj et al. ....... 439/66 |
| 5,969,953 A | | 10/1999 | Purdom et al. ............ 361/790 |
| 6,008,534 A | * | 12/1999 | Fulcher ..................... 257/690 |
| 6,036,502 A | | 3/2000 | Neidich et al. ............. 439/67 |
| 6,203,331 B1 | * | 3/2001 | McHugh et al. ............ 439/71 |
| 6,274,823 B1 | * | 8/2001 | Khandros et al. .......... 174/261 |
| 6,335,491 B1 | * | 1/2002 | Alagaratnam et al. ..... 174/260 |
| 6,386,890 B1 | * | 5/2002 | Bhatt et al. ................. 439/66 |

OTHER PUBLICATIONS

IBM Technical Disclosure Bulletin, Jan., 1993, "Button Contacts for Probe Card Applications", pp. 186–187.
IBM Technical Disclosure Bulletin, Mar., 1991, "Pluggable/Removable Cube of Chips Packaging Method", pp. 459–460.

* cited by examiner

Primary Examiner—Albert W. Paladini
Assistant Examiner—J B Patel
(74) Attorney, Agent, or Firm—James A. Lucas; Driggs, Lucas, Brubaker & Hogg Co., LPA

(57) ABSTRACT

The details of a printed wiring board (PWB) sub-assembly and the method of producing the same are described. The sub-assembly comprises a printed circuit board electrically joined through a plurality of connections to one or more area array devices, such as modules or printed wiring boards. The sub-assembly can serve as a part of an original assembly. The sub-assembly can function as an after market item that can be readily substituted as a replacement for a failed component wherein the dimensional space between the printed circuit board and one or both of the area array devices must provide sufficient clearance for surface mounted devices.

8 Claims, 4 Drawing Sheets

PRINTED WIRING BOARD INTERPOSER SUB-ASSEMBLY

FIELD OF THE INVENTION

This invention relates to electronic sub-assemblies, and particularly to structures comprising a printed wiring board laminate that is electrically and mechanically connected through an interposer connector to an area array device, such as another board, a module or other active or passive device.

BACKGROUND OF THE INVENTION

The mechanical and electrical core of a computer system comprises a plurality of printed wiring boards interconnected with other boards or modules and with other active or passive devices, such as diodes, semiconductors, capacitors and resistors. The success or failure of such computer systems is dependent upon, among other factors, their ability to operate without mechanical breakdowns and electrical failures.

One type of computer system is a microprocessor called a network server. A principal function of a network server is to achieve organized channels of communication between a plurality of personal computers. It also serves to house many programs that it shares with the personal computers. Thus, the reliable operation of the server is critical to the operation of an entire network of such personal computers.

The interconnection between the mating surfaces of a printed wiring board and a module or other active or passive device may be provided through an interposer. An interposer is a structure that provides electrical contact between two such devices (hereinafter referred to as area array devices). These area array devices typically are approximately parallel. The electrical connection between an area array device and a printed wiring board is achieved by pressing the device and the wiring board together with the thin conductive interposer between the two. The interposer can include compressible conductive elastomers, coil springs or leaf springs to establish the electrical connection between the wiring board and the other device.

The need for area array connectors is growing due to the increase in inputs and outputs on area array modules. An area array connector is a type of high-density, low-inductance socket available from a number of suppliers. These connectors may be any one of a number of different types. One such socket uses compressible 'fuzz buttons'. These are compressible wadded wires described, for example, in the following patents: U.S. Pat. Nos. 5,552,752; 5,146,453 and 5,631,446. These are small, irregularly wound and intertwined pads or balls that are made of gold plated beryllium copper wool or gold plated molybdenum wire. These wadded wire balls are compressed in holes in the interposer, which is a thin sheet of insulative material that separates the printed wiring board from the area array device. The holes are arranged in a pattern that matches a pattern of conductive pads on the surfaces of the printed wiring board and the area array device in contact with the interposer. In the assembly process, the 'fuzz buttons' are compressed between the conductive pads, thereby providing electrical connections between the pairs of pads on the two surfaces that are separated by the interposer. Among the other types of connectors are metal filled elastomers, such as those sold by Tyco Inc. (formerly Thomas & Betts) as Metal Particle Interconnect Elastomers. Metal springs are also used. These metal springs generally are leaf springs having a number of geometries, such as C-shaped or V-shaped. Soldered connections complicate the disassembly or separation of the printed wiring board from the area array modules if repair or replacement is required.

A limitation of this type of interconnect technology is the inherent failure rate that can be obtained while placing electrical contacts in series. The intrinsic failure rate of electrical contacts in series can be approximated by:

$$\text{Failure rate} = n \cdot \text{IFR},$$

wherein

Failure Rate equals the contacts in series n=number of contacts in series

IFR=intrinsic failure of each contact interface.

Therefore, addition of more electrical contacts in series typically increases the failure rate of an electrical circuit.

Land grid area array interposers have been described in which an interposer is designed for electrically connecting an electrical device to a printed circuit board wherein the interposer has been fabricated to provide adequate stand-off between the electrical device and the printed circuit board to provide space for active and/or passive devices.

To provide a connection between a printed wiring board and another area array device (which may be a second printed wiring board) using a land grid array (LGA) connector, a space of about 3 mm is needed to allow clearance for any active or passive devices, such as diodes, capacitors and capacitors that are mounted on the surface of the board. An option is to request the vendors of the connector to devise a custom connector that provides the needed height. As is well recognized, the customization of any piece of hardware or software can add appreciably to the overall product development schedule, as well as the cost of assembly and/or use.

BRIEF DESCRIPTION OF THE INVENTION

The present invention relates to an electronic sub-assembly and its method of manufacture. The sub-assembly comprises a printed wiring board (PWB) having a first surface including a plurality of vias terminating at electrical contacts at said surface. These contacts generally are in the form of contact pads. A first area array device having a surface, including a plurality of electrical contacts, is spaced from the PWB. A plurality of connectors electrically couple the electrical contacts on the surface of the PWB to the electrical contacts on the surface of the first area array device. The printed wiring board typically has a second surface that includes a plurality of electrical contacts that are coupled to the second surface of the PWB by a plurality of connectors. The vias extend through the PWB to form electrically conductive plated through holes.

In one embodiment, an interposer separates the first surface of the printed wiring board from the surface of the first area array device. A second interposer may also separate the second surface of the PWB from the second area array device. Each of the interposers includes the connectors that couple said printed circuit board to the respective area array device. The area array devices may be spaced a fixed minimum distance from the printed wiring board, preferably a distance of about 3 mm. The sub-assembly preferably uses connectors that are selected from the group consisting of compressible wadded wire contacts, metal springs, filled conductive elastomers, solder balls and hard solder balls.

For ease of repair and replacement, the connectors are compressible wadded wire having a first end soldered to said contact pads and a second end compressed against the electrical contacts on the surface of the area array device. This allows the area array device to be easily detached from the sub-assembly.

Means are also provided for maintaining a fixed minimum spacing between the PWB and each area array device The invention also relates to a printed wiring board sub-assembly. The printed wiring board has a first surface containing one or more vias extending from the first surface into the board, and a conductive contact pad on the surface of the printed wiring board electrically joined to each of said vias. An interposer structure has a first surface facing the first surface of the printed wiring board, and a second surface. The structure includes a pattern of holes extending therethrough that correspond to the holes in the printed wiring board. Wadded wire electrical contacts are pressed into each hole in the pattern. Each of the electrical contacts has a first end that is soldered or is pasted to a contact pad on the first surface of the printed wiring board. The second end of the wadded wire contact is electrically coupled by compressive contact to a conductive lead on a surface of a module or another printed wiring board.

At least some of the vias typically extend through the board to form plated through holes that terminate at a second board surface. A second interposer structure can be joined to contact pads on the second surface in a manner similar to that of the first interposer to provide an interconnect to a second area array device.

In yet another embodiment, the invention relates to an electronic sub-assembly that comprises a PWB spaced a fixed minimum distance from an area array device, and the method of making the same. The printed wiring board has a first surface including a plurality of vias extending from the surface into the board. A plurality of electrical contact pads are connected to each of the vias, at least some of the contact pads being offset from the corresponding vias. The area array device has a surface including a plurality of electrical contacts. The surface of the PWB and the surface of the area array device are spaced a fixed minimum distance, preferably about 3 mm, from one another. A plurality of connectors electrically couple the contact pads on the surface of the printed circuit board to the electrical contacts on the surface of the area array device. The connectors are selected from the group consisting of compressible wadded wire contacts, metal springs, filled conductive elastomers, solder balls and hard solder balls. The hard solder balls typically are composed of copper balls coated with a layer containing tin. If normal solder balls are used, they may be embedded in an underfill material filling the space between the printed wiring board and the area array device. The wadded wire connectors, filled elastomers and metal springs typically are used by placing them in holes extending through the interposer between the surface of the PWB and the corresponding surface of the area array device. The interposer may also comprise a pair of plastic caps, each cap including a lip extending over an edge of the PWB.

In yet another embodiment, an electronic sub-assembly comprises a printed wiring board having first and second generally planar surfaces and a plurality of vias terminating in electrical contact pads on the surfaces. A first area array device has a generally planar surface facing the first generally planar surface of the printed wiring board. The surface of the array device has a plurality of electrical contacts thereon. A plurality of connectors electrically couple the electrical contacts on the first surface of the printed circuit board to the electrical contacts on the surface of the first area array device. These connectors can be wadded wire contacts, metal springs, filled conductive elastomers, solder balls or hard balls or combinations thereof. A first interposer separates the first surface of the printed wiring board from the surface of the first area array device a fixed minimum distance of about 3 mm. The interposer contains a pattern of holes corresponding in location to the contacts on the first surface of the printed wiring board and the connectors are positioned in these holes. The sub-assembly further includes a second area array device having a surface including a plurality of electrical contacts for electrically coupling the second surface of the printed circuit board to the second area array device. A second interposer separates the second surface of the printed wiring board from the surface of the second area array device. As with the first interposer, the second interposer contains a pattern of holes. These holes correspond in location to the contacts on the second surface of the printed wiring board. A plurality of connectors are positioned in the pattern of holes in the second interposer for electrically coupling the electrical contacts on the second surface of the printed circuit board to the electrical contacts on the surface of the second area array device. At least some of the electrical contacts on one or both of the generally planar surfaces of the printed wiring board comprise contact pads that are offset from the corresponding vias in the printed wiring board to which the contact pads are electrically connected. At least some of the connectors in the holes of said interposers have a first end soldered or pasted to contact pads on a surface of the printed wiring board, while the second end is pressed against the electrical contacts on the generally planar surface of the corresponding area array device without soldering or pasting. The invention also contemplates that the second interposer may separate the second surface of the printed wiring board a fixed minimum distance of about 3 mm from the surface of the second area array device.

DETAILED DESCRIPTION OF THE INVENTION

Land grid area array interposers have been described in which an interposer is designed and fabricated for electrically connecting an electrical device to a printed circuit board wherein the interposer has been specifically designed to provide adequate stand-off between an electrical device and a printed wiring board to provide space for active and/or passive devices mounted thereto.

Figure 1:
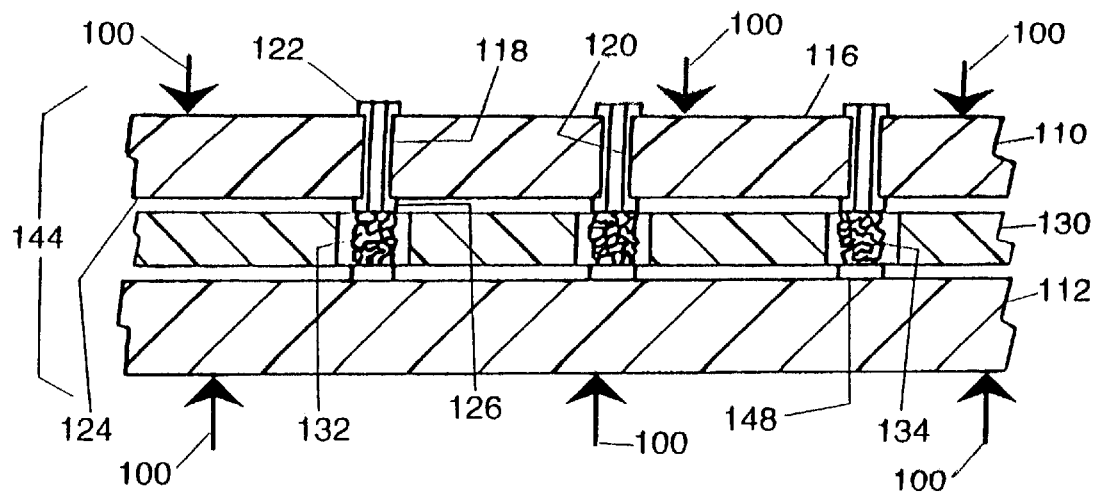
FIG. 1 a circuit board assembly using an interposer with wadded wire electrical contacts compressed between two circuitized substrates according to the teachings of the present invention.

Turning to the drawings for greater detail, FIG. 1 shows a circuit board assembly comprising a printed wiring board 110 electrically connected to an area array device 112, such as a printed circuit board or module. The printed wiring board 110 includes a plurality of vias 120 extending from the surface 124 into the board. Conductive pads 122 are soldered, pasted or plated to the openings of each via 120 on the top surface 116 of the PWB 110, and pads 126 are soldered, pasted or plated to the bottom surface 124 of the PWB 110.

An interposer sheet 130 is provided with holes 132 positionally corresponding to the vias 120 on the bottom surface 124 of the PWB 110. Each hole 132 is filled with wadded wire 134. One end of the wadded wires in the interposer sheet 130 is placed in contact with the contact pads 126 on the bottom surface 124 of the PWB and is soldered thereto.

The area array device 112 contains electrical contacts or interfaces 148 on the board surface facing the PWB 110. The contacts are positioned to abut the other end of the wadded wire contacts 134. The wadded wire contact is compressed to the plated through hole 120 to form an electrical contact from the pads 148 on the module 112 to the plated through hole 120 using a conventional clamping device of the type commonly employed in the art. For purposes of illustration, the clamping pressure in FIG. 1 is shown by opposing arrows 100 and is capable of evenly distributing clamping pressure to the mating surfaces of the PWB 110, the area array device 112, and the two surfaces of the interposer sheet 130. The clamping means 100 can, for example, comprise several C-clamps placed around the edges of the mating surfaces sandwiched between backing plates (not shown). Instead, a plurality of bolts can extend through holes in the various layers of the sandwich and through backing plates, and can be secured by nuts to provide the clamping pressure.

In accordance with one embodiment of the invention, the solder is then reflowed to form the electrical connection between the contact pad 126 and the wadded wire 134 in the interposer 112. This then comprises the interposer sub-assembly 144. However, the interface between the wadded wire and the contact pad 148 is not soldered and, thus, remains separable, relying only on the clamping pressure to maintain electrical contact. This mechanical connection then facilitates the disassembly of the wiring board 110 and the area array device 112.

Figure 2:
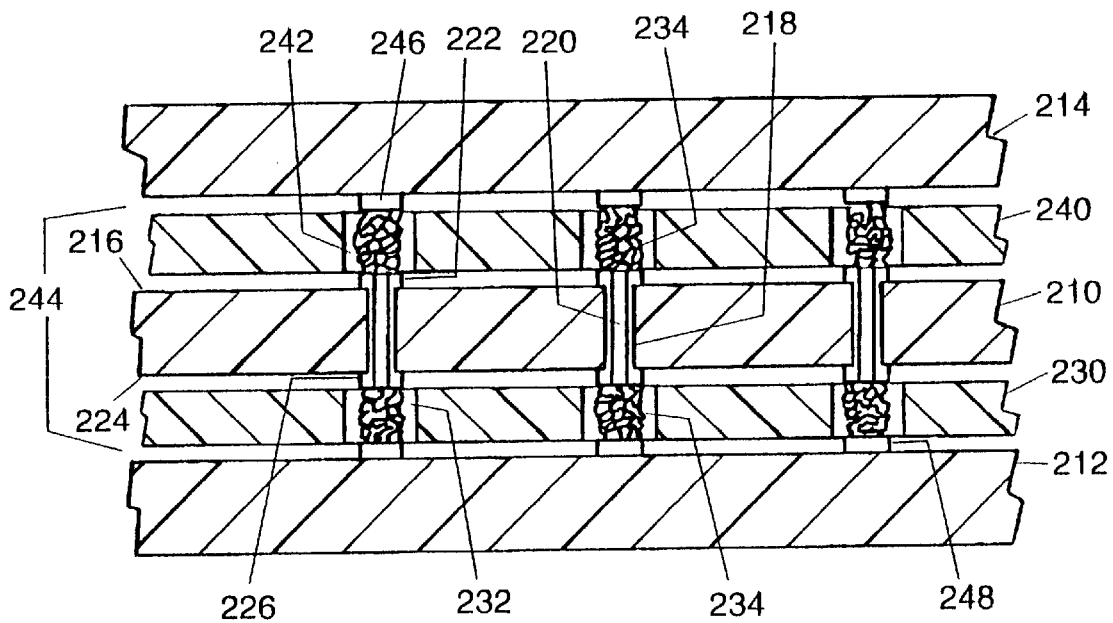
FIG. 2 shows a similar assembly with two interposers with wadded wire connections between ee circuitized substrates.

Referring now to FIG. 2, an interposer sub-assembly 244 comprises an inner PWB 210 containing a plurality of vias 220 extending between the surfaces of the PWB to form plated through holes (PTH)s 218. These PTHs join conductive pads 222 on the upper surface 216 of the PWB 210 to corresponding conductive pads 226 on the bottom surface 224 of the PWB 210. The upper pads 222 contact fuzz buttons 234 pressed into holes 242 in interposer 240. The fuzz buttons, in turn, make electrical contact with contact pads 246 on the upper area array device 214. The pads 226 on the lower surface 224 of the PWB 210 are electrically and mechanically coupled to a lower area array device 212 through fuzz buttons of wadded wire 234 compressed into holes 232 in the interposer sheet 230. The electrical connections from wadded wire 234 to the conductive pad 226 and the wadded wire 234 to conductive pad 222 is augmented with solder, conductive paste, or other permanent connection to improve control reliability or improve handling by reducing the number of loose pieces. On the other hand, mechanically coupling the sub-assembly 244 to the area array devices without solder or paste facilitates disassembly for repair and replacement. Another advantage of this system is increased design flexibility with minimum inventory. Modifications can be made in the thickness of the printed circuit board 210 to allow the same interposers 230, 240 to accommodate multiple standoff heights and/or component heights on devices 212, 214.

It should be understood that the invention can also be practiced by replacing the fuzz buttons 234 with springs, such as C-springs made by Intercon Corporation, or by the use of electrically conductive polymers or solder balls or other means for effecting an electrical connection between the PWB and the devices that are spaced from the PWB.

The present invention also relates to the use of a standard height connector to get a fixed minimum space between the printed wiring board and the area array device. A 3 mm gap is adequate for many standard devices used in the industry today. The PWB is a laminate structure that can be soldered to a daughter card using established processes. The contact pads have a dog-bone structure on both the top and the bottom surfaces of the board, and these pads are electrically joined to the plated through holes. The plated through holes can be as small as 0.010" for an interposer thickness up to 0.110". For greater thickness, larger PTHs are required.

Figure 3:
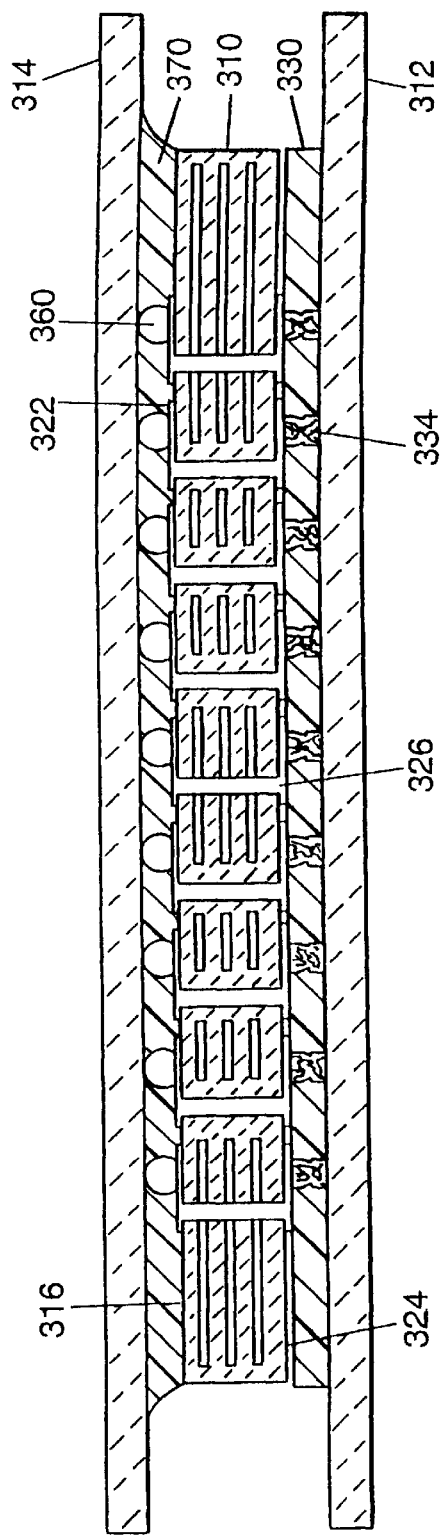
FIG. 3 shows a circuit board assembly using wadded wire contacts, and an underfill material.

Turning now to FIG. 3, a PWB 310 is shown between a lower area array device 312 and an upper area array device 314. The PWB 310 is shown as a laminated structure comprising conductive metal layers 328 embedded in a prepeg. The PWB contains a plurality of vias extending through the PWB to form plated through holes 318 joining the upper surface 316 of the PWB with its lower surface 324. The PTHs 318 are joined to conductive pads 322 on the upper surface 316 and to corresponding conductive pads 326 on the bottom surface 324. The pads 322 are offset from the vias 318 in a so-called dog bone configuration. This permits the use of enlarged pads to establish electrical contact between the two surfaces of the PWB and the corresponding surfaces of the modules. The upper pads 322 contact solder balls 360 which, in turn, make electrical contact with the upper area array device 314. The solder balls are supported by use of an underfill material 370 in accordance with well established practices. The underfill serves to reduce the creep of the solder balls under compression load and improves the fatigue life of the solder balls due to thermal strains. The pads 326 on the bottom surface 324 of the PCB are electrically connected to the lower area array device 312 through fuzz buttons 334 compressed into holes 332 in the interposer 330 in the manner previously described. As can be seen from the drawing, with the use of the dog bone configuration for the pads, it is not necessary to have an exact alignment between the solder balls, the plated through holes and the fuzz buttons. It should be understood that solder balls, metal springs or other connectors can be substituted for the fuzz buttons in the interposer.

Figure 4:
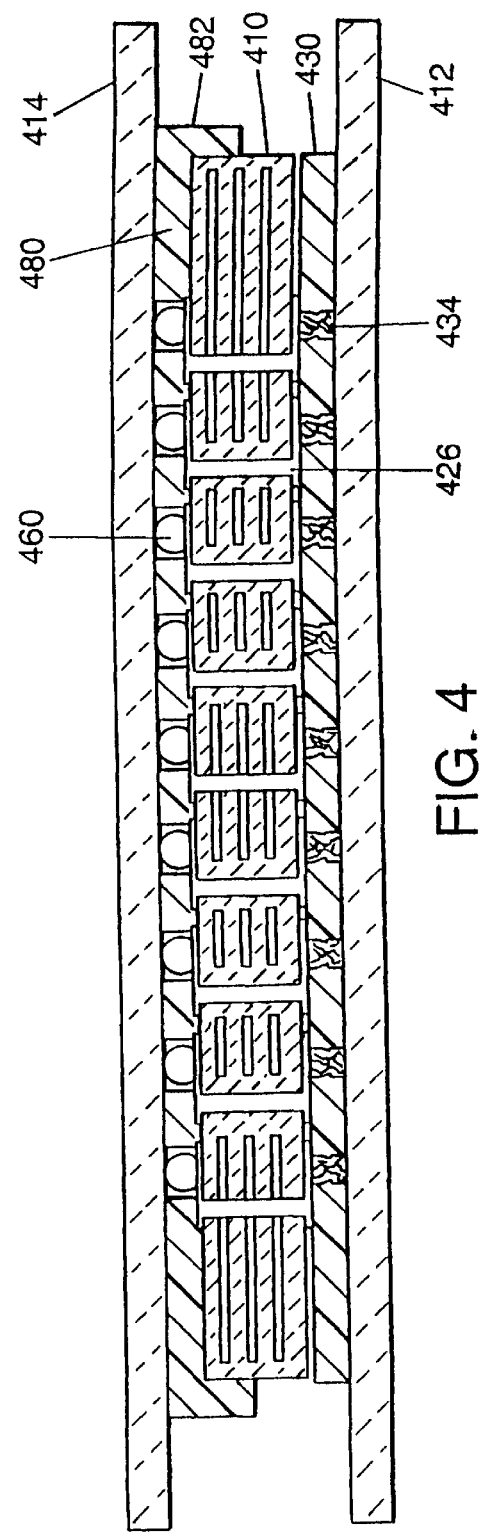
FIG. 4 shows another circuit board assembly using a stand-off interposer.
Figure 5:
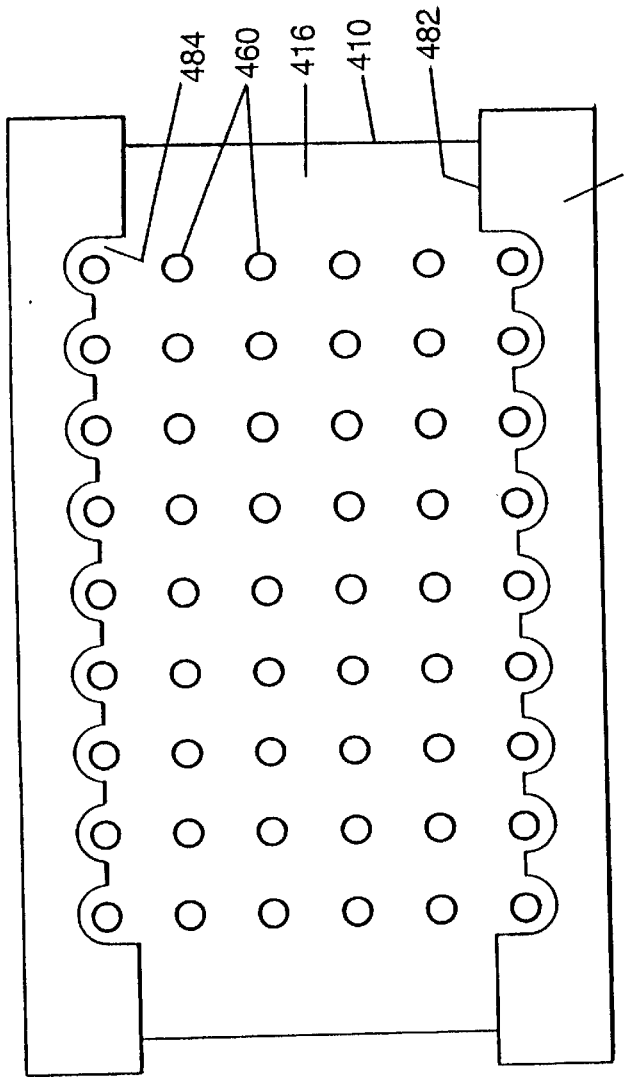
FIG. 5 is a planar view of the interposer and printed circuit board of FIG. 4.

To avoid the need to use an underfill material to control movement of the solder balls, a plastic comb structure as shown in FIGS. 4 and 5 may be used. This structure provides a physical limit between a PWB 410 such as a mother board and a mezzanine device 414. This plastic comb structure comprises a pair of plastic caps 480 to prevent the collapse of the solder balls 460 between the device 414 and the printed wiring board 410 when the components are clamped together. Each cap includes a lip 482 extending downward over the edge of the PWB. The lips serve to accurately position the interposer with respect to the PWB and to restrict relative movement between these two components. The caps include a plurality of semi-circular cutouts 484 corresponding to the outer row of solder balls 460. The thickness of the caps is at least as great as the diameter of the solder balls. Thus, when the assembly is clamped together, the balls are not flattened or damaged by the compressive forces. Furthermore, the caps 480 allow the area array device 414 to be removed for purposes of rework or replacement.

The PWB 410 contains several conductive layers 428 laminated therein, and a plurality of plated through holes 418 extending therethrough. These holes 418 connect with conductive pads 426 on the bottom surface 424 of the PWB 410. An interposer sheet 430 contacts the bottom surface 424 and contains a plurality of holes 432 into which wadded wire fuzz buttons 434 are pressed. The dog-bone shape of the pads 422, 426 permits the solder balls 460 and wadded wire 434 to make electrical contact through the conductive PTHs, even though the solder balls and the wadded wire are not located directly above or below the plated through holes. The caps 480 typically are added after the PWB 410 and the top module 414 are soldered together and cleaned. Thus, even if the two members creep toward one another, there is a set limit, as determined by the thickness of the cap, that will keep them apart and will avoid an electrical short between the solder balls.

Figure 6:
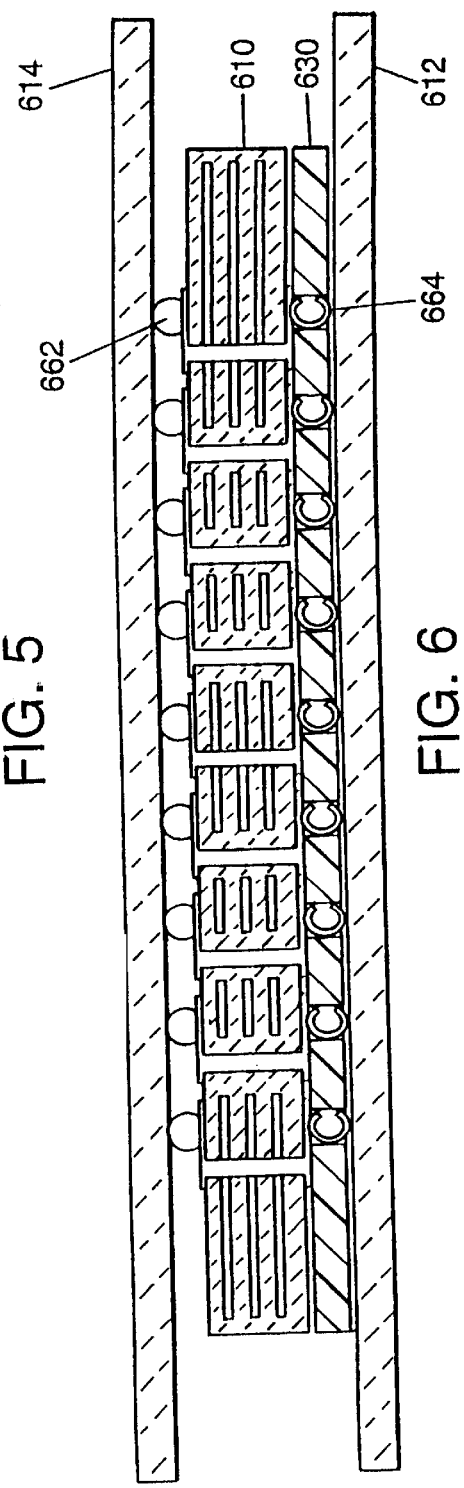
FIG. 6 shows another circuit board assembly with C-spring connectors and a ball grid array using hard electrically conductive balls.

FIG. 6 shows an arrangement wherein the deformable solder balls are replaced by hard electrically conductive balls composed of, for example, copper cores plated with a surface layer of tin or a tin alloy. The sub-assembly 644 comprises a printed wiring board 610, an array of hard electrically conductive solder balls 662, and an upper device 614 as another printed wiring board or a module. The PWB 610 contains a plurality of plated through holes 618 connected to a plurality of conductive pads 622 arranged in a dog-bone pattern on the upper surface 616 and to another set of offset pads 626 on its bottom surface 624. As previously noted, this dog-bone arrangement of the pads eliminates the necessity of placing the hard solder balls directly over the PTHs and the C-springs directly beneath the PTHs. The hard balls 662 complete the electrical contacts between the pads 622 and the module 614. The hard balls 662 resist collapse when the sub-assembly 644, the upper device 614 and the lower device 612 are clamped together. With this arrangement of hard solder balls, no underfill material or plastic caps are needed to keep the solder balls from being collapsed under pressure. The sub-assembly 644 is soldered and cleaned, and is then ready to be connected to a lower device 612 via the land grid array connector. For this, an interposer sheet 630 contains a pattern of holes 632 containing C-springs 664. This construction allows a thick interposer sub-assembly to be constructed with internal ground and power planes to reduce the noise and inductance that are inherent in long electrical leads. As previously described, the C-springs can be replaced with other types of electrical connectors, such a wadded wire, without departing from the present invention.

The electrical connectors through the interposer may be selected from a number of different types. Among these are metal filled polymers. Others are compressible wadded wires commonly referred to as fuzz buttons. Metal springs, as previously described, may also be used.

The interposer is generally planar and is made from plastic or similar material having good mechanical strength and dimensional stability. It usually is an insulator made from plastic material, such as a polyphenylsulfide resin known as Ryton R-4 sold by Phillips 66 Corporation, or a liquid crystal polymer, such as VECTRA E130i available from Hoechst Celanese Corporation. The interposer serves to electrically and mechanically isolate the area array devices from the printed wiring board.

Figure 7:
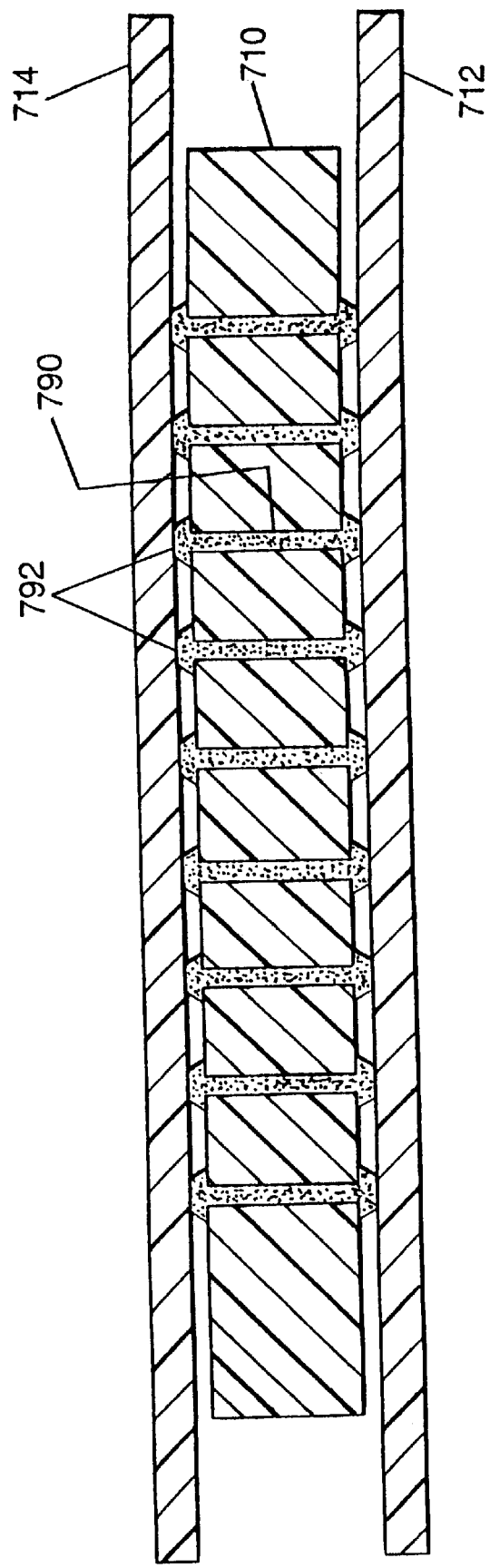
FIG. 7 shows another circuit board assembly using conductive rubber contact pads.

Turning now to FIG. 7, another embodiment is shown wherein a thick interposer 730 includes a plurality of holes extending therethrough, filled with a conductive paste 790, such as a cured silver filled elastomeric compound. Each hole is filled with a carefully controlled excess of the compound which is then cured or hardened. Upon hardening, the excess forms a contact button 792 on the top surface of the interposer and another contact button 794 on the bottom surface. The interposer is clamped between an upper area array device 714 and a lower area array device 712 to form a completed assembly. The various contact points on the two area array devices are not shown in the drawing. The interposer 730 and the contact buttons 792, 794 serve to maintain a minimum space of about 3 mm, for example, between the two area array devices.

The costs associated with the constructing and qualifying of specialized interposers is reduced by following the teachings of the present invention. Further, variations in size and thickness from one interposer to the other are reduced. The invention utilizes the advantages of metal-to-metal contact throughout the system. It allows the use of solder joints in compression to improve their reliability.

The specific details and operation of the sub-assembly described herein as well as the details of the various passive and active devices that are used here are known to persons of ordinary skill in the art. Accordingly, these details do not comprise a part of the present invention, except to the extent that they and their operation have been modified to become part of the present invention.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. An electronic sub-assembly comprising a printed wiring board having a first surface and a second surface and including a plurality of vias extending through the printed wiring board and terminating at electrical contact pads at said first and second surfaces,
   a first area array device having a surface including a plurality of electrical contacts;
   a plurality of connectors for electrically coupling the electrical contacts on the first surface of the printed circuit board to the electrical contacts on the surface of the fit area array device, the connectors comprising solder balls and including means for resisting deformation of the solder balls under compression;
   a second area array device having a surface including a plurality of electrical contacts; and
   an interposer separating the second surface of the printed wiring board from the surface of the second area array device, the interposer including connectors that couple said printed circuit board to the second area array device, said connectors being different than the solder balls.

2. The sub-assembly according to claim 1 wherein the second area array device is spaced a fixed minimum distance of about 3 mm from the printed wiring board.

3. The sub-assembly according to claim 1 wherein the printed circuit board contains a plurality of plated through holes connecting the two surfaces, and at least some of the electrical contacts on one or both of the generally planar surfaces of the printed wiring board comprise contact pads that are offset from the corresponding holes in the printed wiring board to which the contact pads are electrically connected.

4. The sub-assembly according to claim 1 wherein the connectors between the second surface of the printed wiring board and the second area array device are compressible wadded wire contacts having a first end soldered or bonded to the contact pads on the second spice of the printed wiring boards, and a second end mechanically compressed against the electrical contacts on the generally planar surface of the second area array device.

5. The sub-assembly according to claim 1 wherein the solder balls are embedded in an underfill material filling the space between the first surface of the printed wiring board and the first area array device.

6. A printed wiring board sub-assembly comprising:

a printed wiring board having a first surface containing one or more vias extending into the board, and a conductive contact pad on the first surface of the printed wiring board electrically joined to each via;

an area array device spaced a distance of about 3 mm from the first surface of the printed wiring board;

an interposer structure between the printed wiring board and the area array device, having a first surface facing the surface of the printed wiring board, and a second surface, a pattern of holes through the structure corresponding in location to the contact pads on the surface of the printed wiring board, and electrical contacts positioned in each hole in the pattern, each of said contacts comprising wadded wire having a first end facing the first surface of the printed wiring board, said first end of each electrical contact of the interposer structure soldered or pasted to a contact pad on the surface of the printed wiring board, and a second end electrically coupled by compressive contact to a conductive lead on a surface of said area array device.

7. The sub-assembly according to claim 6 wherein the printed wiring board has a second surface and at least some of the vias extend through the board and terminate at the second surface at conductive contact pads on said surface, a second interposer structure having first and second surfaces, a pattern of holes corresponding to the contact pads on the second surface of the printed wiring board, and wadded wire electrical contacts pressed into each hole in the pattern, with one end of each wadded wire contact joined by soldering or pasting to the corresponding contact pad on the second surface of the printed wiring board;

and the other end of each wadded wire contact is electrically joined by compressive contact to a conductive lead on a surface of a module or another printed wiring board.

8. The sub-assembly according to claim 6 further including a second area array device having a surface including a plurality of electrical contacts, a plurality of solder balls electrically coupling pads on a second planar surface of the printed wiring board to the second area array device, and means for limiting the movement of the solder balls.

* * * * *